(12) United States Patent
Chen et al.

(10) Patent No.: US 9,595,505 B2
(45) Date of Patent: Mar. 14, 2017

(54) THERMALLY-ENHANCED THREE DIMENSIONAL SYSTEM-IN-PACKAGES AND METHODS FOR THE FABRICATION THEREOF

(71) Applicants: Shouhui Chen, Mesa, AZ (US); Guat Kew Teh, Bukit Jelutong (MY); Wai Keong Wong, Shah Alam (MY)

(72) Inventors: Shouhui Chen, Mesa, AZ (US); Guat Kew Teh, Bukit Jelutong (MY); Wai Keong Wong, Shah Alam (MY)

(73) Assignee: NXP USA, INC., Austin, TX (US)

( * ) Notice: Subject to any disclaimer, the term of this patent is extended or adjusted under 35 U.S.C. 154(b) by 12 days.

(21) Appl. No.: 14/552,943

(22) Filed: Nov. 25, 2014

(65) Prior Publication Data

US 2016/0148902 A1 May 26, 2016

(51) Int. Cl.
*H01L 23/10* (2006.01)
*H01L 23/48* (2006.01)
(Continued)

(52) U.S. Cl.
CPC ........ *H01L 25/0652* (2013.01); *H01L 23/367* (2013.01); *H01L 23/4985* (2013.01); *H01L 25/50* (2013.01); *H01L 23/473* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/13025* (2013.01); *H01L 2224/16227* (2013.01); *H01L 2224/291* (2013.01); *H01L 2224/293* (2013.01); *H01L 2224/2929* (2013.01); *H01L 2224/29339* (2013.01); *H01L 2224/29347* (2013.01); *H01L 2224/32245* (2013.01); *H01L 2224/48247* (2013.01); *H01L 2224/73253* (2013.01); *H01L 2224/73265* (2013.01); *H01L 2224/8385* (2013.01);
(Continued)

(58) Field of Classification Search
CPC ....... H01L 2224/32145; H01L 2224/83; H01L 2225/06527; H01L 2225/1094; H01L 23/4093
See application file for complete search history.

(56) References Cited

U.S. PATENT DOCUMENTS 5,963,427 A * 10/1999 Bollesen ............. H01L 23/3675
257/719
6,838,754 B2 1/2005 Kim
(Continued)

*Primary Examiner* — Bradley K Smith
*Assistant Examiner* — David Goodwin

(57) ABSTRACT

Embodiments of three dimensional (3D) System-in-Package (SiPs) and methods for producing 3D SiPs having improved heat dissipation capabilities are provided. In one embodiment, the 3D SiP includes a heat-dissipating structure having a first principal surface and a second principal surface opposite the first principal surface. The backside of a first microelectronic device is disposed adjacent and thermally coupled to the first principal surface of the heat-dissipating structure, while the backside of a second microelectronic device is disposed adjacent and thermally coupled to the second principal surface of the heat-dissipating structure. During operation of the 3D SiP, heat generated by the microelectronic devices is conductively transferred to and dissipated through the heat-dissipating structure.

19 Claims, 2 Drawing Sheets

(51) Int. Cl.
  *H01L 25/065*   (2006.01)
  *H01L 25/00*   (2006.01)
  *H01L 23/498*   (2006.01)
  *H01L 23/367*   (2006.01)
  *H01L 23/00*   (2006.01)
  *H01L 23/473*   (2006.01)

(52) U.S. Cl.
  CPC ............... *H01L 2224/83805* (2013.01); *H01L 2224/92225* (2013.01); *H01L 2225/06541* (2013.01); *H01L 2225/06558* (2013.01); *H01L 2225/06572* (2013.01); *H01L 2225/06575* (2013.01); *H01L 2225/06589* (2013.01); *H01L 2924/00014* (2013.01); *H01L 2924/14* (2013.01); *H01L 2924/1421* (2013.01); *H01L 2924/1434* (2013.01)

(56) References Cited

U.S. PATENT DOCUMENTS

| | | |
|---|---|---|
| 7,378,300 B2 | 5/2008 | Marimuthu et al. |
| 2006/0050498 A1* | 3/2006 | Cady .................. G11C 5/04 361/803 |
| 2006/0060963 A1* | 3/2006 | Chang .................. H01L 25/0652 257/706 |
| 2007/0108604 A1 | 5/2007 | Yim |
| 2007/0176286 A1* | 8/2007 | Wehrly ............... H01L 25/0655 257/723 |
| 2009/0121326 A1* | 5/2009 | Kim ..................... H01L 25/105 257/666 |
| 2009/0174044 A1* | 7/2009 | Eom ..................... H01L 21/56 257/675 |
| 2010/0059880 A1* | 3/2010 | Baek .................... H01L 23/467 257/713 |
| 2011/0157835 A1* | 6/2011 | Feng ................... H01L 23/4093 361/718 |
| 2012/0139124 A1* | 6/2012 | Oganesian ............ H01L 23/481 257/774 |
| 2013/0093074 A1* | 4/2013 | Grant .................. H01L 23/3675 257/693 |
| 2013/0186595 A1* | 7/2013 | Hsieh .................. H01L 23/4093 165/80.2 |
| 2014/0048951 A1* | 2/2014 | Lin ...................... H01L 23/481 257/774 |

\* cited by examiner

THERMALLY-ENHANCED THREE DIMENSIONAL SYSTEM-IN-PACKAGES AND METHODS FOR THE FABRICATION THEREOF

TECHNICAL FIELD

Embodiments of the present invention relate generally to microelectronic packaging and, more particularly, to three dimensional System-in-Packages having improved heat dissipation capabilities and methods for the fabrication thereof.

BACKGROUND

A microelectronic package contains one or more microelectronic devices. When containing multiple interconnected microelectronic devices, the microelectronic package may also be referred to as a "System-in-Package" or "SiP." The microelectronic devices contained within a SiP can include various different combinations of semiconductor die, Microelectromechanical Systems (MEMS) devices, optical devices, Radio Frequency (RF) antenna structures, and passive components, such as discrete capacitors, resistors, diodes, and inductors. Advancements in packaging have brought about significant reductions in SiP size and corresponding improvements in SiP device density. As SiP device density increases, heat concentrations within the SiP also tend to increase in severity. Consequently, it can be important to ensure that excess heat generated by the devices within a highly dense SiP is efficiently dissipated to ensure proper SiP operation. Efficient heat dissipation can also be important when, regardless of size, a given SiP contains RF circuitry or other high power devices prone to the generation of excess heat during operation.

It is thus desirable to provide SiPs and methods for fabricating SiPs capable of dissipating relatively large quantities of heat generated by devices contained within the SiP in a reliable and efficient manner (referred to herein as "thermally-enhanced SiPs"). It would be particularly desirable if, in at least some embodiments, the thermally-enhanced SiP could be produced to have reduced planform dimensions and a relatively high device density, while maintaining its ability to effectively dissipate excess heat. It would still further be desirable if embodiments of the thermally-enhanced SiP could provide relatively high mechanical stabilities and/or could enable integration of existing circuit-carrying semiconductor die into the SiP without significant redesign or retooling. Other desirable features and characteristics provided by embodiments of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
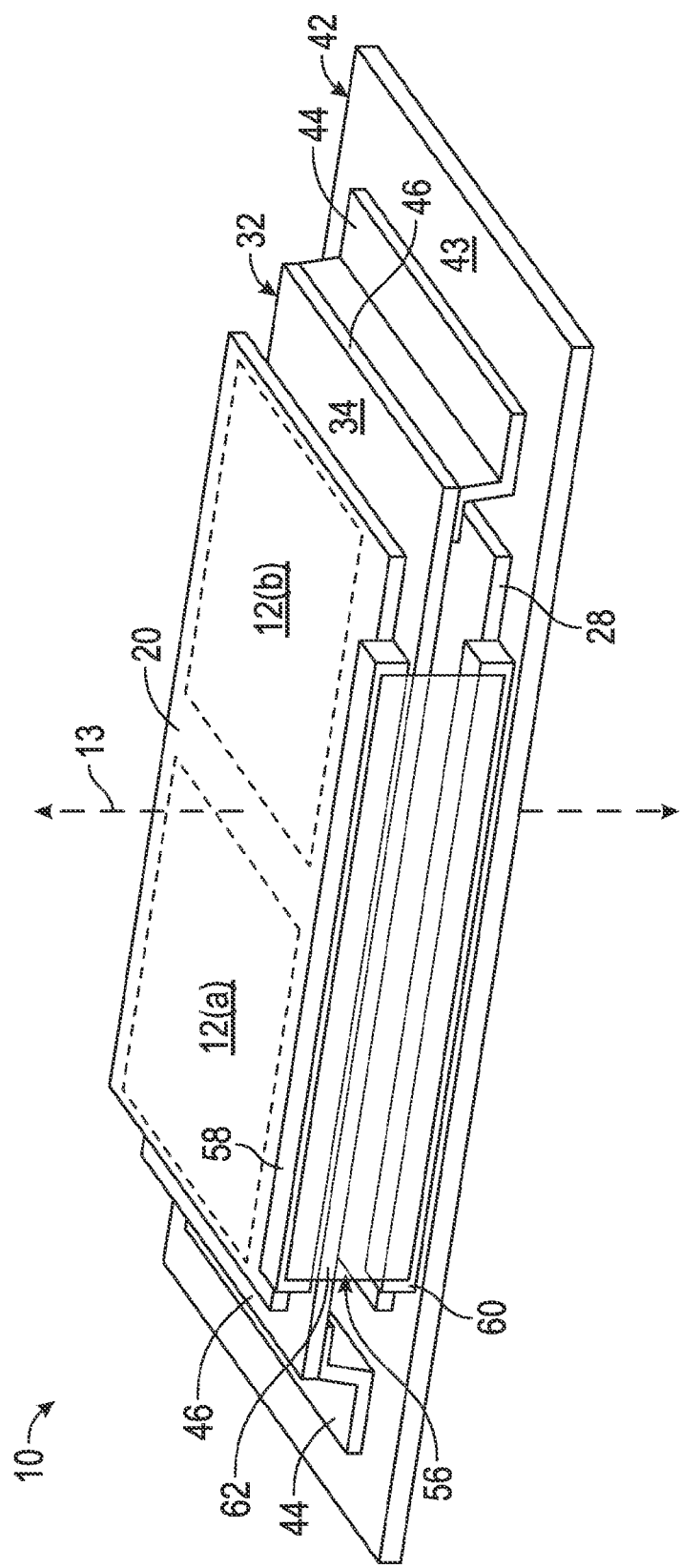
FIGS. 1 and 2 are isometric and cross-sectional views, respectively, of a three dimensional System-in-Package including a thermally-conductive, heat-dissipating structure disposed between back-to-back microelectronic devices or device layers, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes exemplary embodiments of thermally-enhanced three-dimensional (3D) SiPs and methods for producing thermally-enhanced 3D SiPs. As indicated by the term "three dimensional," the SiP contains at least first and second microelectronic devices, which are located at different levels or in different device planes within the package and separated by a thermally-conductive, heat-dissipating structure. The first microelectronic device (e.g., a first semiconductor die) can be inverted relative to the second microelectronic device (e.g., a second semiconductor die) and the respective backsides of the devices can be thermally coupled to opposing surfaces of the heat-dissipating structure. The heat-dissipating structure provides a highly robust thermal conduction path for removing heat generated by the microelectronic devices from the SiP. In certain embodiments, the heat-dissipating structure can also provide additional functionalities, such as a ground plane connection or leadframe-based signal routing. The first and second microelectronic devices can be supported by first and second substrates, respectively, which may be electrically interconnected to provide signal and/or power routing between the devices.

Due, at least in part, to its 3D package architecture, embodiments of the thermally-enhanced SiP can be produced to have highly compact planform dimensions. Embodiments of the SiP are consequently well-suited for usage within mobile phones and other portable electronics in which envelope constraints are a primary concern. It is emphasized, however, that embodiments of the thermally-enhanced SiP are not restricted to any particular application and can be employed in any instance in which efficient heat dissipation is desired (regardless of SiP size) (e.g., when the SiP contains RF circuitry or other high power devices prone to the generation of excess heat). Additional benefits of the thermally-enhanced SiP can include high mechanical stabilities and the ability to integrate existing semiconductor die into the SiP without significant redesign or tooling modifications. An exemplary embodiment of a thermally-enhanced 3D SiP will now be described in conjunction with FIGS. 1 and 2.

Figure 2:
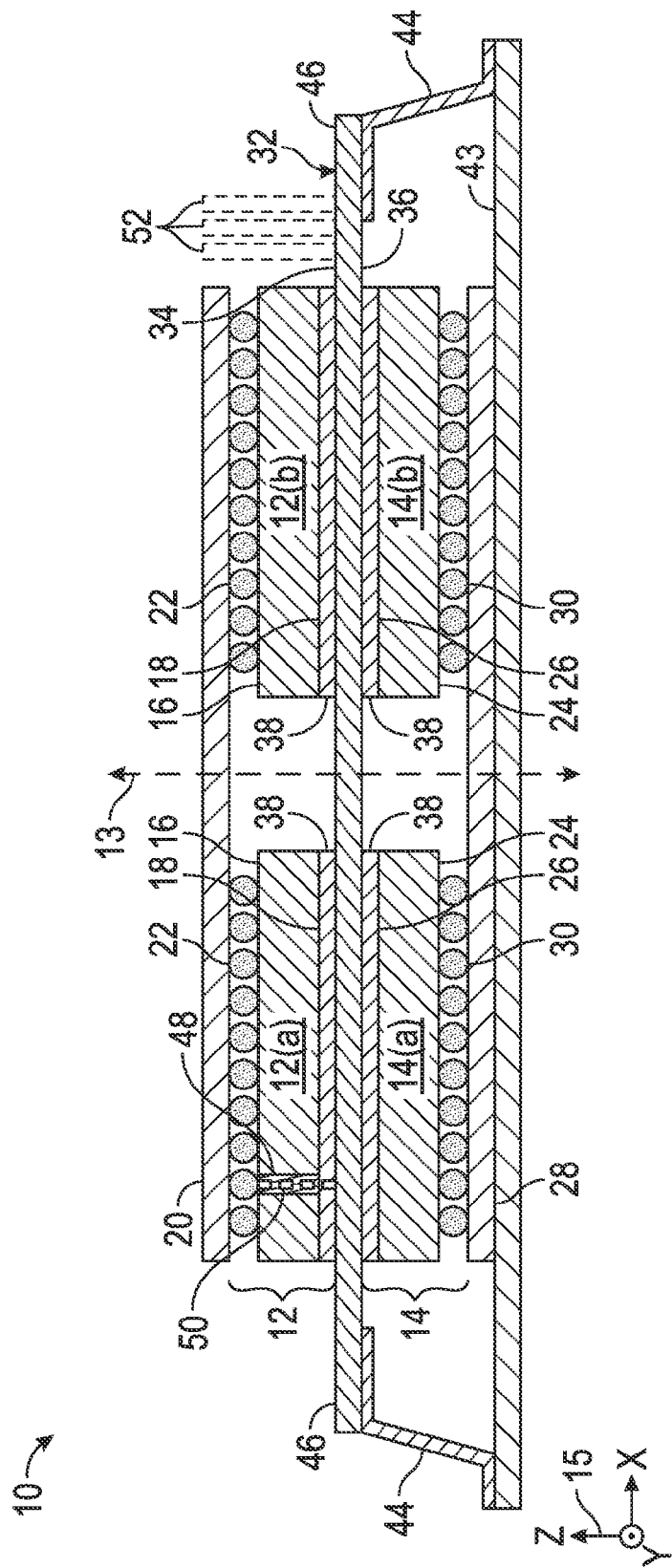

FIGS. 1 and 2 are isometric and cross-sectional views, respectively, of a thermally-enhanced 3D SiP 10, as illustrated in accordance with an exemplary embodiment of the present invention. As shown most clearly in FIG. 2, 3D SiP 10 includes a first device plane or layer 12 and a second device plane or layer 14. Device layers 12 and 14 are located at different levels or elevations within SiP 10. Stated differently, device layers 12 and 14 are distributed along different horizontally-extending planes, which are spaced apart along the centerline of SiP 10 (represented by dashed line 13 and corresponding to the Z-axis identified in FIG. 2 by coordinate legend 15). Device layers 12 and 14 can each include any number and type of microelectronic devices. In the illustrated embodiment, and by way of non-limiting example only, device layer 12 includes two semiconductor die 12(a)-(b), which are positioned in a laterally adjacent or side-by-side relationship. Similarly, device layer 14 includes two semiconductor die 14(a)-(b), which are positioned in a side-by-side relationship. In further embodiments, device layer 12 and device layer 14 can include other types of microelectronic devices in addition to or in lieu of semiconductor die. A non-exhaustive list of microelectronic components suitable for inclusion in device layers 12 and 14 includes semiconductor die, MEMS devices, optical devices, RF antenna structures, and other small scale electronic devices capable of providing processing, memory, sensing, RF, optical, energy harvesting, and actuator functionalities. The microelectronic devices contained in device layers 12 and 14 can also include Surface Mount Devices (SMDs) and other passive electronic components, such as discrete inductors, resistors, capacitors, or diodes.

As identified in FIG. 2, semiconductor die 12(a)-(b) each include a frontside 16 and an opposing backside 18. Integrated circuits (ICs) have been produced on the frontsides 16 of semiconductor die 12(a)-(b) along with a number of bond pads during wafer level processing. Semiconductor die 12(a)-(b) are mounted to and electrically interconnected with a first substrate 20, which is a Printed Circuit Board (PCB) in an embodiment. Different mounting and interconnection schemes can be utilized to provide the desired mechanical and electrical connections between die 12(a)-(b) and substrate 20. For example, as shown in FIG. 2, a Ball Grid Array (BGA) 22 or other contact array (e.g., a pin grid array or land grid array) can be employed for this purpose. Semiconductor die 12(a)-(b) likewise each include a backside 26 and an opposing frontside 24, which carries one or more ICs and bond pads. Die 14(a)-(b) are supported by a second substrate 28 (e.g., a second PCB) with the desired mechanical and electrical connections provided by two additional BGAs 30. Again, it is emphasized that this is a non-limiting example and that other surface mounting approaches can be utilized to electrically and mechanically interconnect die 14(a)-(b) to substrate 28 in further embodiments of SiP 10.

Semiconductor die 12(a)-(b) are inverted relative to semiconductor die 14(a)-(b) such that the frontsides 16 of die 12(a)-(b) and the frontsides 24 of die 14(a)-(b) face opposing directions. In the illustrated embodiment, semiconductor die 12(a) and 14(a) are further positioned in a back-to-back relationship, as are semiconductor die 12(b) and 14(b). As appearing herein, the term "back-to-back," denotes that the respective backsides of two named components (e.g., backsides 18 and 26 of die 12(a) and 14(a) or backsides 18 and 26 of die 12(b) and 14(b)) face opposing directions and that at least a portion of named components (die 12(a) and 14(a) or die 12(b) and 14(b)) overlap axially, as taken along an axis parallel to centerline 13 of SiP 10. The term "back-to-back," then, does not require that physical contact exist between the axially-opposed microelectronic devices. Indeed, axially-opposed die pairs (i.e., die pair 12(a), 14(a) and die pair 12(b), 14(b)) do not contact in the embodiment shown in FIGS. 1-2 and are instead separated by an intervening heat-dissipating structure of the type described below. Due to the inverted disposition of substrate 20 and the devices mounted thereto (e.g., die 12(a)-(b)), the surfaces of substrates 20 and 28 to which device layers 12 and 14 are mounted, respectively, face each other and face heat dissipating structure 32.

A thermally-conductive, heat-dissipating structure 32 is disposed between device layers 12 and 14 and, more specifically, between die 12(a)-(b) and die 14(a)-(b). Heat-dissipating structure 32 includes opposing principal surfaces 34 and 36. Die 12(a)-(b) and die 14(a)-(b) are positioned axially adjacent surface 34 and 36, respectively, of structure 32. Specifically, die 12(a)-(b) can physically contact or can be bonded to surface 34, while die 14(a)-(b) can physically contact or can be bonded to surface 36. In the embodiment illustrated in FIGS. 1 and 2, and as shown most clearly in FIG. 2, die 12(a)-(b) and die 14(a)-(b) are bonded directly to opposing principal surfaces 34 and 36 of heat-dissipating structure 32 utilizing one or more layers of thermally-conductive adhesive 38. The selected thermally-conductive adhesive can have a thermal conductivity exceeding about 5 watts per meter kelvin (W/m·K) in an embodiment; the term "about," as appearing herein, denoting a disparity of less than 10%. A non-exhaustive list of thermally-conductive adhesives suitable for this purpose includes silver-filled epoxies, copper-filed epoxies, and other metal-filled epoxies. Additionally, solder, eutectic materials (e.g., silicon-gold eutectics), and other metal or alloy-based adhesives can also be utilized as the thermally-conductive adhesive in certain embodiments. By virtue of this configuration, relatively direct and robust thermal transfer paths are from die 12(a)-(b), through surface 34, to the body of heat-dissipating structure 32; and from die 14(a)-(b), through surface 36, to the body of structure 32. Heat-dissipating structure 32 thus provides a highly efficient thermal path (essentially, a heat bus) for dissipating excess heat generated by die 12(a)-(b) and die 14(a)-(b) away from the center of SiP 20 during operation thereof.

Heat-dissipating structure 32 can be fabricated from one or more thermally-conductive materials; the term "thermally-conductive material" defined herein as a material having a thermal conductivity exceeding 5 W/m·K. Suitable materials include, but are not limited to copper, aluminum, and other metals. The regions of heat-dissipating structure 32 contacted by or bonded to semiconductor die 12(a)-(b) and die 14(a)-(b) are also preferably unbroken or continuous to maximize the surface area of structure 32 in direct thermal communication with die 12(a)-(b) and die 14(a)-(b). Stated differently, when viewed along centerline 13 in a first direction (a bottom-up direction in the orientation shown in FIGS. 1 and 2), heat dissipating structure 32 preferably overlays or covers the majority and, more preferably, the substantial entirety of the respective backsides 18 of die 12(a)-(b); and, when viewed along centerline 13 in an opposing direction (a top-down direction in the illustrated orientation), heat dissipating structure 32 preferably covers the majority and, more preferably, the substantial entirety of the respective backsides 26 of die 14(a)-(b).

The particular form assumed by heat-dissipating structure 32 will vary based upon whether structure 32 provides additional functionalities beyond heat dissipation and mechanical support. As indicated in FIGS. 1 and 2, heat-dissipating structure 32 can assume the form of a relatively simple metal sheet or plate having a generally rectangular planform geometry. Heat-dissipating structure 32 can be electrically inactive (non-current-conducting) and serve only as a thermal conduit or heat sink for removing excess heat from die 12(a)-(b) and die 14(a)-(b). Alternatively, heat-dissipating structure 32 can be electrically-active and serve as a ground plane. In this case, one or more of the microelectronic devices contained within device layers 12 and 14 can be electrically coupled to heat-dissipating structure 32. For example, Through Silicon Vias (TSVs) can be formed in any or all of die 12(a)-(b) and die 14(a)-(b) to provide the desired electrical connections to heat-dissipating structure 32 through bonding layers 38, which can be produced from an electrically conductive material. To further emphasize this point, a TSV 48 is shown in FIG. 2 for semiconductor die 12(a), which cooperates with the corresponding bond layers 38 to provide an electrically conductive path 50 extending from the frontside 16 of die 12(a) to structure 32. In further embodiments, additional TSVs or other electrically-conductive interconnect structures (e.g., wire bonds) can be utilized to electrically couple die 12(a)-(b) or die 14(a)-(b) to heat-dissipating structure 32. Moreover, in still further embodiments, heat-dissipating structure 32 can be a leadframe, which provides signal routing between one or more of die 12(a)-(b) and die 14(a)-(b) and the Input/Output (I/O) interface of SiP 10 (not shown). In such embodiments, electrical interconnection between die 12(a)-(b) and die 14(a)-(b) and different regions of heat-dissipating structure 32 can again be provided utilizing TSVs, wire bonding, or another electrically-conductive interconnect structure.

Heat-dissipating structure 32 can serve as the primary or main heat sink of SiP 10, in which case the heat absorbed into structure 32 can be removed therefrom principally by convective cooling. If this should be the case, heat-dissipating structure 32 can be produced to include a number of extensions or pin-fins 52 (shown in phantom in the right hand side of FIG. 2) to increase the convectively-cooled surface area of structure 32. Additionally or alternatively, heat-dissipating structure 32 can be exposed to an actively-circulated liquid or gas coolant of some type. For example, a micro fan or other mechanism can be utilized to direct forced airflow over the outer surface of structure 32 during SiP operation. It is preferred, however, that heat-dissipating structure 32 is thermally coupled to another thermally-conductive body or structure, which may have a volume greater than that of the structure 32. In this case, the larger, thermally-conductive body may serve as the primary heat sink, while heat-dissipating structure 32 serves more as a thermal conduit for conductively transferring heat from die 12(a)-(b) and die 14(a)-(b) to the primary heat sink. For example, as indicated in FIGS. 1 and 2, SiP 10 can further include a thermally-conductive base piece 42 (e.g., a metal plate, heat sink, or a casing) to which structure 32 is thermally coupled. Heat-dissipating structure 32 can directly contact base piece 42 or, instead, may be physically coupled thereto through one or more thermally-conductive connector pieces. For example, to facilitate heat transfer from heat-dissipating structure 32 to base piece 42, metal clips 44 can be provided between base piece 42 and an outer peripheral portions 46 of structure 32, which project laterally beyond device layers 12 and 14. Metal clips 44 can be produced as discrete pieces or, instead, integrally formed with heat-dissipating structure 32 or base piece 42 as a single piece. Metal clips 44 can also help physically support heat-dissipating structure 32 and add to the overall structural integrity of SiP 10. To provide additional mechanical support and/or to further enhance heat transfer to base piece 42, substrate 28 can be bonded to a principal surface 43 of base piece 42 opposite device layer 14.

One or more electrical connections can be provided between substrates 20 and 28 to electrically interconnect die 12(a)-(b) and die 14(a)-(b) and help complete the wiring structure of SiP 10. Any substrate-to-substrate interconnection suitable for providing signal routing between substrates 20 and 28 can be utilized for this purpose. For example, as shown in FIG. 1, a flexible PCB interconnect 56 (also commonly referred to as a "flexible printed circuit connector") can provide signal routing between substrates 20 and 28 and, therefore, around the intervening heat-dissipating structure 32. Flexible PCB interconnect 56 includes a first connector end 58, which is electrically connected to an outer edge portion of substrate 20; a second connector end 60, which is connected to an outer edge portion of substrate 28; and a flexible body 62, which extends between connector ends 58 and 60. During assembly of SiP 10, flexible PCB interconnect 56 can be electrically interconnected with substrates 20 and 28 to yield a bendable substrate assembly 20, 28, 56. Device layers 12 and 14 can be mounted to substrates 20 and 28, respectively, prior to or after interconnection of substrates 20 and 28. The bendable substrate assembly 20, 28, 56 can be then be folded around heat-dissipating structure 32 and, if desired, the microelectronic devices of device layers 12 and 14 can be bonded to opposing surfaces 34 and 36 of structure 32 to yield SiP 20. In further embodiments, other fabrication methods can be utilized to produce SiP 10. The end result is a 3D SiP having excellent heat dissipation capabilities, a relatively high mechanical strength, and a footprint that can be made highly compact, if so desired.

The foregoing has thus provided embodiments of a thermally-enhanced 3D SiP capable of dissipating heat in a highly effective manner. Embodiments of the SiP can also be produced to have reduced planform dimensions and relatively high device densities, as appropriate for a particular application or design. In embodiments wherein the thermally-enhanced 3D SiP is produced to have a relatively small planform dimensions, the SiP can be well-suited for usage within portable electronic devices wherein envelope constraints are a primary consideration. For example, the thermally-enhanced 3D SiP can be utilized within mobile phones to minimize the SiP footprint and allow form factor streamlining, to allow enlargement of other components (e.g., a high capacity battery), or for another reason. Regardless of size, embodiments of the thermally-enhanced 3D SiP can also be employed in applications wherein enhanced heat dissipation is desired, such as when the SiP contains RF circuitry or other high power devices prone to the generation of excess heat during operation. Embodiments of the SiPs described above can also be produced to have relatively high mechanical stabilities due, at least in part, to the manner in which the microelectronic devices are bonded to opposing surfaces of the heat-dissipating structure. As a still further benefit, embodiments of the above-described SiPs can allow the integration of existing IC-carrying semiconductor die into the SiP without significant redesign or retooling. For example, the above-described package architecture can enable the utilization of existing wafers and chips with same lead frame, substrate, ball attach, and die attach technologies. In contrast, other known 3D packaging approaches, such as Chip-on-Chip (CoC) packaging approaches, often require new wafer fabrication masking and redesign at added cost.

In one embodiment, the above-described thermally-enhanced 3D SiP includes a heat-dissipating structure having a first principal surface and a second principal surface opposite the first principal surface. The backside of a first microelectronic device is disposed adjacent and thermally coupled to the first principal surface of the heat-dissipating structure, while the backside of a second microelectronic device is disposed adjacent and thermally coupled to the second principal surface of the heat-dissipating structure. The SiP can further include layers of a thermally-conductive adhesive, such as a metal-containing epoxy, which bonds the backside of the microelectronic devices to opposing surfaces of the heat-dissipating structure. The microelectronic devices can be positioned in a back-to-back relationship with the heat-dissipating structure positioned therebetween.

The first microelectronic device can be mounted to a first substrate (e.g., a first PCB), the second microelectronic device can be mounted to a second substrate (e.g., a second PCB), and a substrate-to-substrate interconnection (e.g., a flexible PCB connection) can be provided between the substrates. Collectively, the first PCB, the second PCB, and the flexible PCB connection can form a bendable substrate assembly, which is folded or bent around the heat-dissipating structure. The first and second substrates, the first and second microelectronic devices, and the heat-dissipating structure can overlap axially; that is, as taken along an axis parallel to the SiP centerline. In certain embodiments, the SiP can further include a thermally-conductive base piece (e.g., a metal plate, slug, or casing) to which the second substrate is mounted, as well as a thermally-conductive connector piece extending between the thermally-conductive base piece and the heat-dissipating structure. In this case, the heat-dissipating structure can have an outer edge portion extending laterally beyond the first and second substrates, and the thermally-conductive connector piece can assume the form of a metal clip extending from the outer edge portion to the thermally-conductive base piece. The heat-dissipating structure can be a metal sheet or plate. The microelectronic devices can be electrically isolated from the heat-dissipating structure or may instead be electrically connected thereto, in which case the heat-dissipating structure can also provide a ground plane connection.

In further embodiments, the thermally-enhanced 3D SiP can include first and second PCBs, which are spaced along the SiP centerline. A heat-dissipating structure is positioned between the first and second PCBs. First and second device layers mounted to the first and second PCBs, respectively, and further bonded to opposing surfaces of the heat-dissipating structure. In certain implementations, the first device layer can include a first semiconductor die disposed between the first PCB and the heat-dissipating structure, the second device layer can include a second semiconductor die disposed between the second PCB and the heat-dissipating structure, and the first semiconductor die can be inverted with respect to the second semiconductor die. The heat-dissipating structure can be selected from the group consisting of an electrically-inactive metal plate, a ground plane, and a signal-routing leadframe.

Embodiments of a method for fabricating a thermally-enhanced 3D SiP have also been provided. In one embodiment, the method includes the steps or processes of: (i) positioning first and second microelectronic devices (e.g., semiconductor die) in an axially-spaced or vertically-spaced relationship, and (ii) thermally coupling the first and second microelectronic devices to opposing surfaces of a heat-dissipating structure such that heat generated by the first and second microelectronic devices is transferred to the heat-dissipating structure during operation of the 3D SiP. In embodiments wherein the first and second microelectronic devices are semiconductor die, the step or process of positioning can entail disposing the semiconductor die in a back-to-back relationship. In a further embodiment, the step or process of thermally coupling can include bonding the first and second microelectronic devices to the opposing surfaces of the heat dissipative structure utilizing a thermally-conductive adhesive, such as a metal-containing epoxy. The first and second microelectronic devices can be mounted to first and second substrates (e.g., PCBs), respectively; and the first and second substrates can be electrically interconnected utilizing a substrate-to-substrate connection. In certain cases, the first substrate, the second substrate, and the substrate-to-substrate connection can collectively form a bendable substrate assembly, which can be folded around the heat-dissipating structure after mounting the first and second microelectronic devices to first and second substrates.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic device" is utilized in a broad sense to refer to an electronic device, element, or structure produced on a relatively small scale and amenable to packaging in the above-described manner. As indicated above, microelectronic components include, but are not limited to, integrated circuits formed on semiconductor die, MEMS devices, passive electronic microelectronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the package, such as preformed antenna structures.

What is claimed is:

1. A three dimensional (3D) System-in-Package (SiP) comprising:
   a heat-dissipating structure having a first principal surface and a second principal surface opposite the first principal surface;
   a first microelectronic device having a backside disposed adjacent and thermally coupled to the first principal surface of the heat-dissipating structure;
   a second microelectronic device having a backside disposed adjacent and thermally coupled to the second principal surface of the heat-dissipating structure;
   a first substrate to which the first microelectronic device is mounted;
   a second substrate to which the second microelectronic device is mounted;
   a thermally-conductive base piece to which the second substrate is mounted, the thermally-conductive base piece assuming the form of a metal plate placed in contact with the second substrate; and
   metal clip extending from an outer edge portion of the heat-dissipating structure to the thermally-conductive base piece.

2. The 3D SiP of claim 1 further comprising:
   a first layer of thermally-conductive adhesive bonding the backside of the first microelectronic device to the first principal surface of the heat-dissipating structure; and
   a second layer of thermally-conductive adhesive bonding the backside of the second microelectronic device to the second principal surface of the heat-dissipating structure.

3. The 3D SiP of claim 1 wherein the first and second microelectronic devices are positioned in a back-to-back relationship.

4. The 3D SiP of claim 1 further comprising:
a substrate-to-substrate interconnection electrically coupling the first and second substrates.

5. The 3D SiP of claim 4 wherein the first substrate comprises a first Printed Circuit Board (PCB), wherein the second substrate comprises a second PCB, and wherein the substrate-to-substrate interconnection comprises a flexible PCB connection extending between the first and second PCBs.

6. The 3D SiP of claim 5 wherein the first PCB, the second PCB, and the flexible PCB connection form a bendable substrate assembly, and wherein the bendable substrate assembly is folded around the heat-dissipating structure.

7. The 3D SiP of claim 1 wherein the heat-dissipating structure comprises a metal sheet.

8. The 3D SiP of claim 7 wherein the first and second microelectronic devices are electrically isolated from the metal sheet.

9. The 3D SiP of claim 1 wherein the first and second microelectronic devices are electrically coupled to the heat-dissipating structure.

10. The 3D SiP of claim 9 wherein the heat-dissipating structure comprises a ground plane.

11. A three dimensional (3D) System-in-Package (SiP) having a centerline, comprising:
first and second printed circuit boards (PCBs) spaced along the centerline;
a heat-dissipating structure positioned substantially between the first and second PCBs, the heat-dissipating structure having opposing peripheral portions extending laterally beyond the first and second PCBs;
first and second device layers mounted to the first and second PCBs, respectively, the first and second device layers bonded to opposing surfaces of the heat-dissipating structure;
a thermally-conductive base piece to which the second PCB is mounted; and
thermally-conductive connector pieces extending from the opposing peripheral portions of the heat-dissipating structure to the thermally-conductive base piece;
wherein the heat-dissipating structure comprises a ground plane to which at least one device in each of the first and second device layers is electrically coupled.

12. The 3D SiP of claim 11 wherein the first device layer includes a first semiconductor die disposed between the first PCB and the heat-dissipating structure, wherein the second device layer includes a second semiconductor die disposed between the second PCB and the heat-dissipating structure, and wherein the first semiconductor die is inverted with respect to the second semiconductor die.

13. The 3D SiP of claim 11 wherein the thermally-conductive connector pieces comprise metal clips, which are separately fabricated relative to the thermally-conductive base piece.

14. The 3D SiP of claim 11 wherein the thermally-conductive connector pieces physically support the heat-dissipating structure.

15. The 3D SiP of claim 11 wherein the second PCB is bonded to the thermally-conductive base piece opposite the second device layer.

16. The 3D SiP of claim 11 wherein the volume of thermally-conductive base piece is greater than the volume of the heat-dissipating structure.

17. A three dimensional (3D) System-in-Package (SiP) comprising:
a first microelectronic device having a contact array and a backside;
a second microelectronic device having a contact array and a backside, the second microelectronic device positioned in a side-by-side relationship with the first microelectronic device;
a Printed Circuit Board (PCB) to which the first and second microelectronic devices are mounted, the contact arrays of the first and second microelectronic devices electrically coupled to the PCB;
a thermally-conductive base piece comprising a metal plate bonded to the PCB opposite the first and second microelectronic devices;
a heat-dissipating structure bonded to the backsides of the first and second semiconductor die opposite the PCB; and
a first thermally-conductive connector piece extending from the heat-dissipating structure to the principal surface of the thermally-conductive base piece.

18. The 3D SiP of claim 17 wherein the heat-dissipating structure comprises a first outer peripheral portion projecting laterally beyond the PCB, and wherein the first thermally-conductive connector piece comprises a metal clip affixed between the thermally-conductive base piece and the first outer peripheral portion of the heat-dissipating structure.

19. The 3D SiP of claim 17 further comprising a thermally-conductive adhesive layer bonding the first semiconductor device to the heat-dissipating structure;
wherein the first microelectronic device comprises a semiconductor die having a Through Silicon Via (TSV) electrically coupled to the heat-dissipating structure through the thermally-conductive adhesive layer.

* * * * *